US008785225B2

(12) United States Patent
Wang

(10) Patent No.: US 8,785,225 B2
(45) Date of Patent: Jul. 22, 2014

(54) THIN-FILM TRANSISTOR PIXEL STRUCTURE HAVING SHIELDING LAYER AND MANUFACTURING METHOD THEREOF

(71) Applicant: JinJie Wang, Guangdong (CN)

(72) Inventor: JinJie Wang, Guangdong (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 0 days.

(21) Appl. No.: 13/703,080

(22) PCT Filed: Oct. 15, 2012

(86) PCT No.: PCT/CN2012/082940
§ 371 (c)(1),
(2), (4) Date: Dec. 10, 2012

(87) PCT Pub. No.: WO2014/056234
PCT Pub. Date: Apr. 17, 2014

(65) Prior Publication Data
US 2014/0097436 A1    Apr. 10, 2014

(30) Foreign Application Priority Data
Oct. 10, 2012 (CN) .......................... 2012 1 0382064

(51) Int. Cl.
*H01L 27/12* (2006.01)
*H01L 27/11* (2006.01)
*H01L 27/146* (2006.01)
*H01L 29/08* (2006.01)

(52) U.S. Cl.
CPC ....... *H01L 27/1108* (2013.01); *H01L 27/14692* (2013.01); *H01L 29/0847* (2013.01)
USPC .......................................................... 438/34

(58) Field of Classification Search
CPC .................. H01L 27/1108; H01L 27/14692; H01L 27/7272; H01L 29/0847
USPC ........................................................ 257/59, 72
See application file for complete search history.

(56) References Cited

U.S. PATENT DOCUMENTS

| 8,133,773 | B2 * | 3/2012 | Shih et al. ...................... 438/158 |
| 2009/0152554 | A1 * | 6/2009 | Cho et al. .......................... 257/59 |
| 2010/0295048 | A1 * | 11/2010 | Chung et al. ..................... 257/59 |
| 2011/0062432 | A1 * | 3/2011 | Yamazaki et al. ............... 257/43 |
| 2012/0154728 | A1 * | 6/2012 | Oh et al. ......................... 349/138 |
| 2012/0218488 | A1 * | 8/2012 | Song et al. ........................ 349/43 |
| 2012/0218489 | A1 * | 8/2012 | Lee et al. ......................... 349/43 |

* cited by examiner

*Primary Examiner* — Nathan Ha
(74) *Attorney, Agent, or Firm* — Kirton McConkie; Evan R. Witt

(57) ABSTRACT

A thin-film transistor (TFT) pixel structure and manufacturing method thereof are described. The TFT pixel structure includes a substrate, first conducting layer, gate insulation layer, channel layer, second conducting layer, contact holes, passivation layer and transparent conducting layer. The method includes: forming gate insulation layer on substrate and covering scan lines, gate electrode layer and shielding layer; forming the second conducting layer on substrate; and patterning the second conducting layer for generating data lines, drain layer, and source layer on channel layer to construct thin-film transistors, channel layer being disposed between the shielding layer and source layer, wherein when light beam illuminates on substrate, the shielding layer is correspondingly disposed to channel layer along an emitting direction of the light beam for shielding channel layer from light beam by the shielding layer to solve the problems of abnormal display quality and image sticking and maintain aperture rate.

16 Claims, 9 Drawing Sheets

THIN-FILM TRANSISTOR PIXEL STRUCTURE HAVING SHIELDING LAYER AND MANUFACTURING METHOD THEREOF

FIELD OF THE INVENTION

The present invention relates to a transistor pixel structure, and more particularly to a thin-film transistor (TFT) pixel structure and manufacturing method thereof.

BACKGROUND OF THE INVENTION

The thin-film transistor (TFT) pixel structure are key components of the liquid crystal display (LCD). In the TFT structure, a gate insulation layer GI, semiconductor channel layer AS, source layer SE and passivation layer PV and indium tin oxide (ITO) layer are sequentially stacked on the substrate corresponding to the source electrode.

When the thin-film transistor (TFT) pixel structure are formed by four masks process, the main procedure is that the source layer SE serves as the mask of the semiconductor channel layer AS. However, the semiconductor channel layer AS is a light-sensing semi-conducting material and the pixel voltage of the ITO layer is changed to downgrade the display quality when the backlight illuminates on the semiconductor channel layer AS and the leakage of light beam is induced. Specifically, the test step fails while performing the check process of the image sticking, wherein the image sticking means that a prior still image appears to be overlapped with the following display image. In other words, when the display apparatus displays a still image for a long time, the prior still image stays on the next display image, which disadvantageously interfere the displaying quality of the display apparatus. Consequently, there is a need to develop a transistor pixel structure to solve the problem of the image crosstalk.

SUMMARY OF THE INVENTION

One objective of the present invention is to provide a TFT pixel structure and manufacturing method thereof to solve the problems of abnormal display quality and image sticking.

According to the above objective, the present invention sets forth a TFT pixel structure and manufacturing method thereof. The method for manufacturing a thin-film transistor (TFT) pixel structure includes the steps of:

forming a first conducting layer on a substrate;

patterning the first conducting layer for generating a plurality of scan lines, a gate electrode layer electrically connected to the scan lines, and a shielding layer on the substrate;

forming a gate insulation layer on the substrate for covering the scan lines, the gate electrode layer and the shielding layer;

forming a channel layer on the gate insulation layer wherein the channel layer corresponds to the gate electrode layer;

forming a second conducting layer on the substrate and patterning the second conducting layer for generating a plurality of data lines, a drain layer coupled to the data lines, and a source layer on the channel layer to allow the gate electrode layer, the channel layer, the source layer, the drain layer to construct a plurality of thin-film transistors, the channel layer being disposed between the shielding layer and the source layer, wherein when a light beam illuminates on the substrate, the shielding layer is correspondingly disposed to the channel layer along an emitting direction of the light beam for shielding the channel layer from the light beam by using the shielding layer; and forming a transparent conducting layer to be coupled to the source layer for generating a plurality of pixel electrodes.

In one embodiment, the shielding layer includes either an opaque material layer or a reflective material layer.

In one embodiment, either the opaque material layer or the reflective material layer comprises a metal layer.

In one embodiment, the shielding layer is correspondingly disposed to the source layer.

In one embodiment, a width of the shielding layer is either greater than or equal to a width of the channel layer.

In one embodiment, a width of the shielding layer is either equal to or less than a width of the source layer.

In one embodiment, the channel layer comprises an amorphous silicon material.

In one embodiment, before the step of forming the transparent conducting layer, further comprising the steps of:

forming a passivation layer on the substrate for covering the data lines and the thin-film transistors; and forming a plurality of contact holes in the passivation layer, wherein each of the contact holes partly exposes the source layer and the transparent conducting layer is filled into the contact holes for electrically connecting the transparent conducting layer to the source layer.

In another embodiment, the present invention provides a thin-film transistor (TFT) pixel structure including:

a substrate;

a first conducting layer disposed on a substrate wherein the first conducting layer comprises a plurality of scan lines, a gate electrode layer electrically connected to the scan lines, and a shielding layer;

a gate insulation layer disposed on the substrate and covering the scan lines, the gate electrode layer and the shielding layer;

a channel layer disposed on the gate insulation layer and corresponding to the gate electrode layer;

a second conducting layer disposed on the substrate and comprising a plurality of data lines, a drain layer coupled to the data lines, and a source layer which are formed on the channel layer to allow the channel layer, the source layer, the drain layer to construct a plurality of thin-film transistors, the channel layer being disposed between the shielding layer and the source layer, wherein when a light beam illuminates on the substrate, the shielding layer is correspondingly disposed to the channel layer along an emitting direction of the light beam for shielding the channel layer from the light beam by using the shielding layer; and a transparent conducting layer, being filled into a plurality of contact holes and electrically coupled to the source layer for generating a plurality of pixel electrodes.

In one embodiment, the shielding layer includes either an opaque material layer or a reflective material layer.

In one embodiment, either the opaque material layer or the reflective material layer comprises a metal layer.

In one embodiment, the shielding layer is correspondingly disposed to the source layer.

In one embodiment, a width of the shielding layer is either greater than or equal to a width of the channel layer.

In one embodiment, a width of the shielding layer is either equal to or less than a width of the source layer.

In one embodiment, the channel layer comprises an amorphous silicon material.

The thin-film transistor (TFT) pixel structure further includes a passivation layer disposed on the substrate for covering the data lines and the thin-film transistors; and the contact holes disposed in the passivation layer, wherein each of the contact holes partly exposes the source layer and the transparent conducting layer is filled into the contact holes for electrically connecting the transparent conducting layer to the source layer.

The TFT pixel structure and manufacturing method thereof can solve the problems of abnormal display quality and image sticking.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1A:
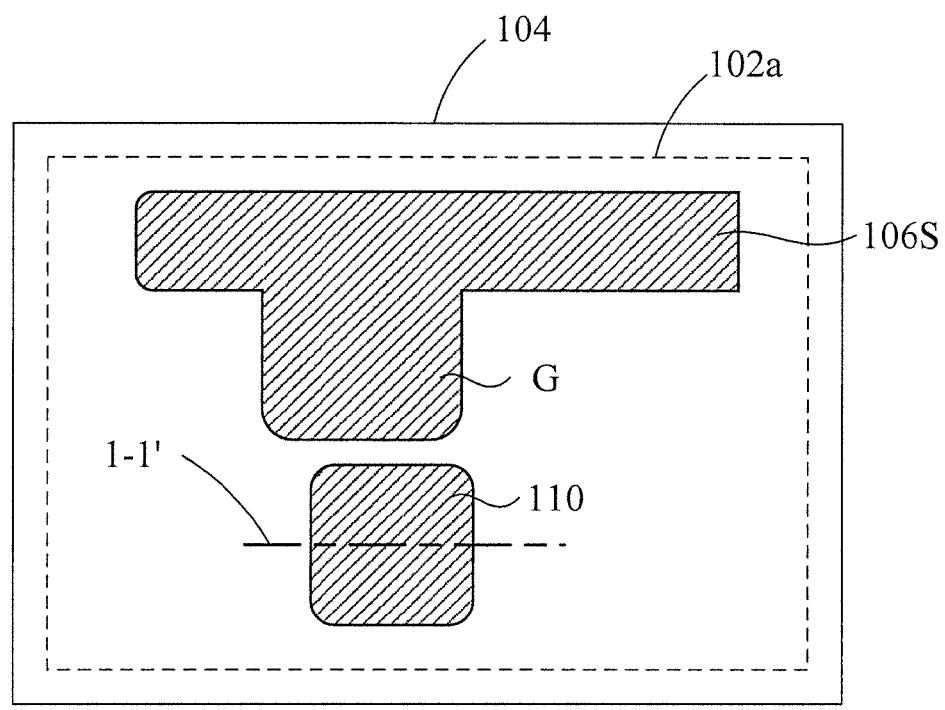
FIG. 1A is a schematic partially planar view of a thin-film transistor (TFT) pixel structure during a first manufacturing step according to one embodiment of the present invention.
Figure 1B:
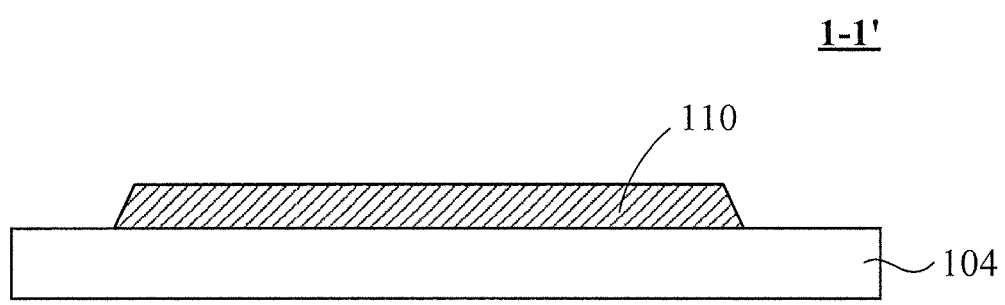
FIG. 1B is a schematic cross-sectional view of the first manufacturing step along the line 1-1' in FIG. 1A according to one embodiment of the present invention.

Please refer to FIG. 1A and FIG. 1B. FIG. 1A is a schematic partially planar view of a thin-film transistor (TFT) pixel structure 100 (shown in FIG. 5A) during a first manufacturing step according to one embodiment of the present invention. FIG. 1B is a schematic cross-sectional view of the first manufacturing step along the line 1-1' in FIG. 1A according to one embodiment of the present invention. As shown in FIG. 1A and FIG. 1B, a first conducting layer 102a is formed on a substrate 104. In one embodiment, the first conducting layer 102a is deposited on the substrate 104. For example, the material of the first conducting layer 102a is metal selected from one group consisting of molybdenum (Mo), aluminum (Al), copper (Cu), titanium (Ti), tantalum (Ta) and wolfram (W).

In FIG. 1A and FIG. 1B, the first conducting layer 102a is patterned to generate a plurality of scan lines 106S, a gate electrode layer G electrically connected to the scan lines 106S, and a shielding layer 110 on the substrate 104. In one preferred embodiment, the scan lines 106S, the gate electrode layer G and the shielding layer 110 are simultaneously formed by a photolithography etching step. In another case, the scan lines 106S, the gate electrode layer G and the shielding layer 110 are formed respectively by different manufacturing steps. The shielding layer 110 includes either an opaque material layer or a reflective material layer which may be a metal layer. It should be noted that the region enclosed by the dotted line is defined as a first conducting layer 102a before performing the patterning step.

Figure 2A:
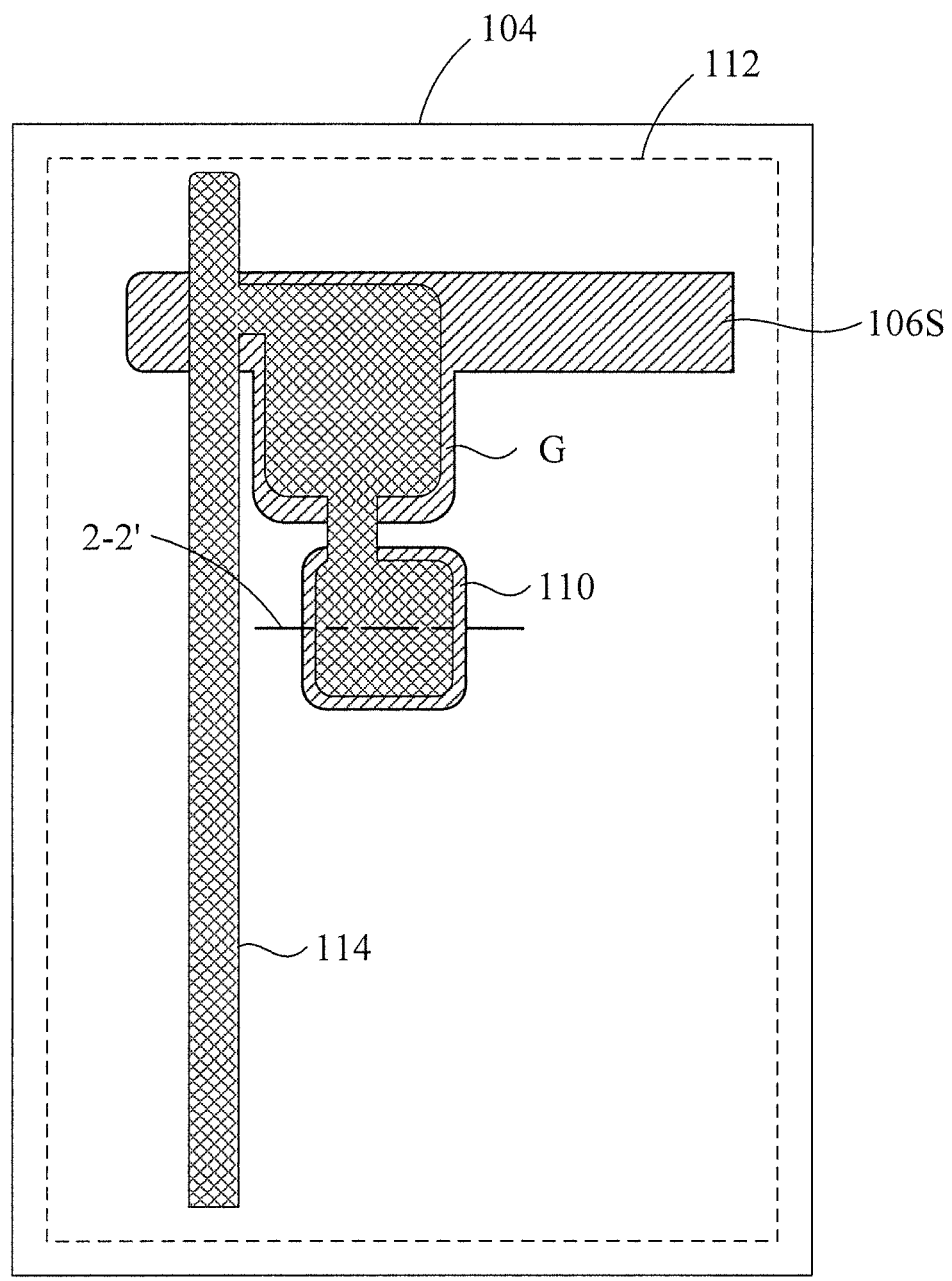
FIG. 2A is a schematic partially planar view of a thin-film transistor (TFT) pixel structure during a second manufacturing step according to one embodiment of the present invention.
Figure 2B:
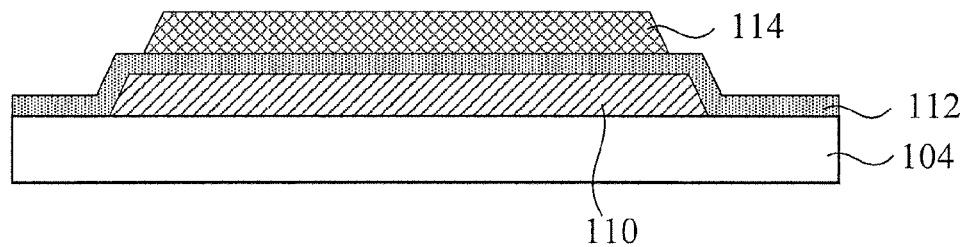
FIG. 2B is a schematic cross-sectional view of the second manufacturing step along the line 2-2' in FIG. 2A according to one embodiment of the present invention.

Please refer to FIG. 2A and FIG. 2B. FIG. 2A is a schematic partially planar view of a thin-film transistor (TFT) pixel structure 100 during a second manufacturing step according to one embodiment of the present invention. FIG. 2B is a schematic cross-sectional view of the second manufacturing step along the line 2-2' in FIG. 2A according to one embodiment of the present invention. As shown in FIG. 2A and FIG. 2B, a gate insulation layer 112 is formed on the substrate 104 for covering the scan lines 106S, the gate electrode layer G and the shielding layer 110. In one embodiment, the gate insulation layer 112 is deposited on the substrate 104 by the photolithography etching step. For example, the gate insulation layer 112 is composed of a silicon oxide layer and a silicon nitride layer.

In FIG. 2A and FIG. 2B, a channel layer 114 is formed on the gate insulation layer 112 wherein the channel layer 114 corresponds to the gate electrode layer G (shown in FIG. 1A) and the region of the channel layer 114 partly projects on the region of gate electrode layer G. Further, the channel layer 114 corresponds to the shielding layer 110. A width of the shielding layer 110 is either greater than or equal to a width of the channel layer 114. In another case, the width of the shielding layer 110 is approximately less than the width of the channel layer 114. The channel layer 114 is deposited on the gate insulation layer 112 by the photolithography etching step. The material of the channel layer 114 includes an amorphous silicon material. An ohmic contact layer (not shown) composed of amorphous silicon material with phosphorous dopant may be formed on the channel layer 114.

Figure 3A:
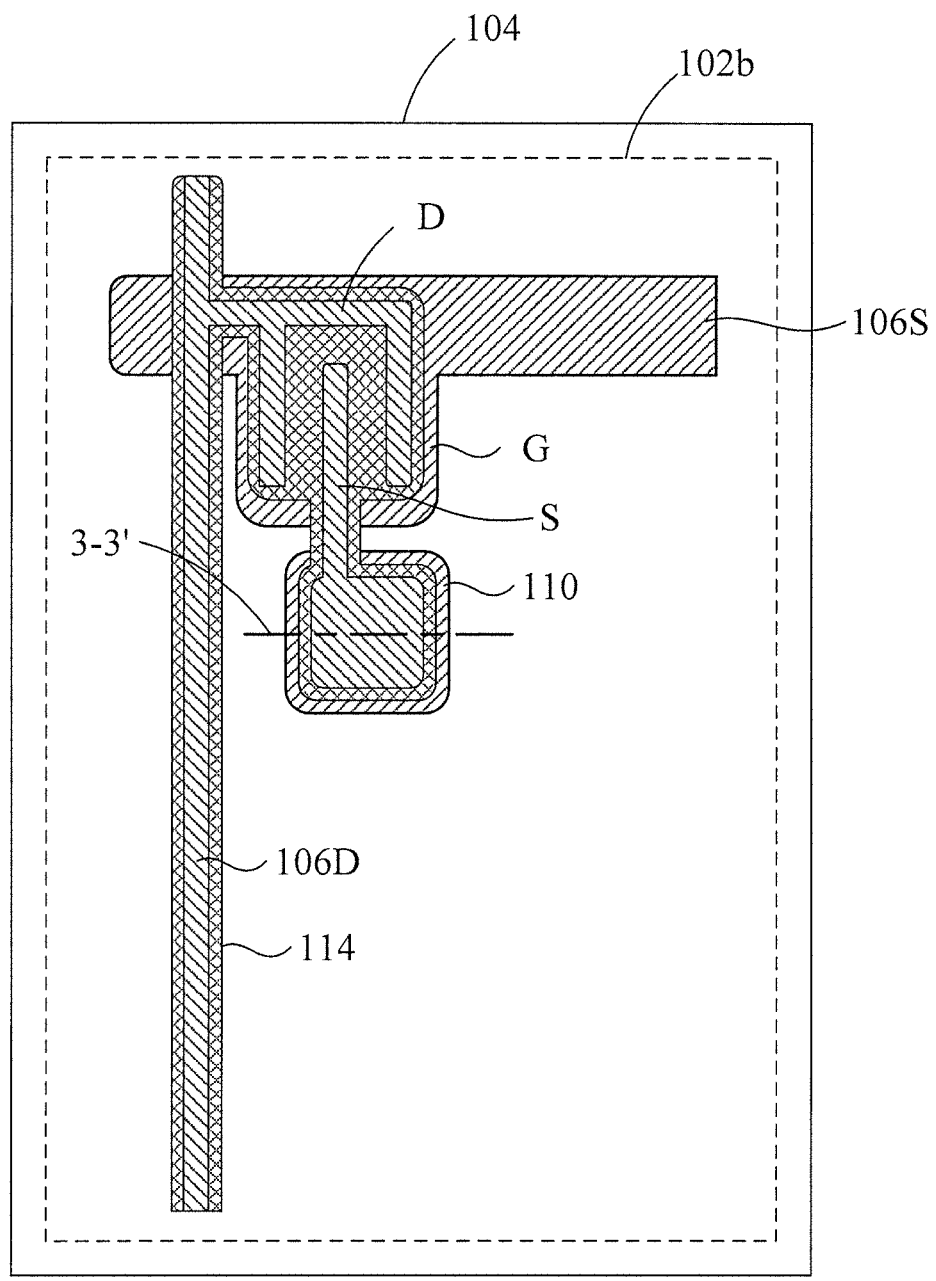
FIG. 3A is a schematic partially planar view of a thin-film transistor (TFT) pixel structure during a third manufacturing step according to one embodiment of the present invention.
Figure 3B:
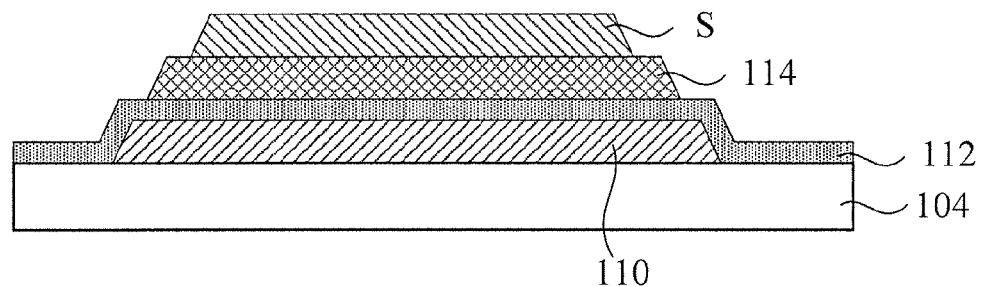
FIG. 3B is a schematic cross-sectional view of the third manufacturing step along the line 3-3' in FIG. 3A according to one embodiment of the present invention.

Please refer to FIG. 3A and FIG. 3B. FIG. 3A is a schematic partially planar view of a thin-film transistor (TFT) pixel structure 100 during a third manufacturing step according to one embodiment of the present invention. FIG. 3B is a schematic cross-sectional view of the third manufacturing step along the line 3-3' in FIG. 3A according to one embodiment of the present invention. As shown in FIG. 3A and 3B, a second conducting layer 102b is formed on the substrate 104 and the second conducting layer 102b is patterned for generating a plurality of data lines 106D, a drain layer D coupled to the data lines 106D, and a source layer S on the channel layer 114 to allow the gate electrode layer G, the channel layer 114, the source layer G, the drain layer D to construct a plurality of thin-film transistors. In this case, a scan line is interlaced with a data line and one pixel unit is taken as an example, but not limited, wherein the TFTs are disposed in the interlaced positions between the scan lines and the data lines.

The channel layer 114 is disposed between the shielding layer 110 and the source layer S and that is, the region of the shielding layer 110 is correspondingly disposed to the region of the source layer S, i.e. the width of the source electrode. When a light beam vertically illuminates on the substrate 104 from the bottom, the shielding layer 110 is correspondingly disposed to the channel layer 114 along an emitting direction of the light beam for shielding the channel layer 114 from the light beam by using the shielding layer 110. Thus, the channel layer 114 can prevent the light current from the leakage so that the channel layer 114 avoids the light beam from the backlight module (not shown) to solve the problems of abnormal display quality and image sticking.

In one embodiment of FIG. 3A and FIG. 3B, a width of the shielding layer 110 is either equal to or less than a width of the source layer S, i.e. the width of the source electrode so that the shielding layer 110 is disposed within the source layer S. In another embodiment, the width of the shielding layer 110 is approximately greater than the width of the source layer S, i.e. the width of the source electrode. Since the material of the source layer S is opaque, the shielding layer 110 advantageously affects the aperture rate of the TFT pixel structure and effectively eliminates the leakage of the light current.

In one embodiment of FIG. 3A and FIG. 3B, the second conducting layer 102b is deposited on the substrate 104 and the second conducting layer 102b is metal selected from one group consisting of molybdenum (Mo), aluminum (Al), copper (Cu), titanium (Ti), tantalum (Ta) and wolfram (W). In one case, the data lines 106D, a drain layer D coupled to the data lines 106D, and a source layer S are deposited on the channel layer 114 by the photolithography etching step.

Figure 4A:
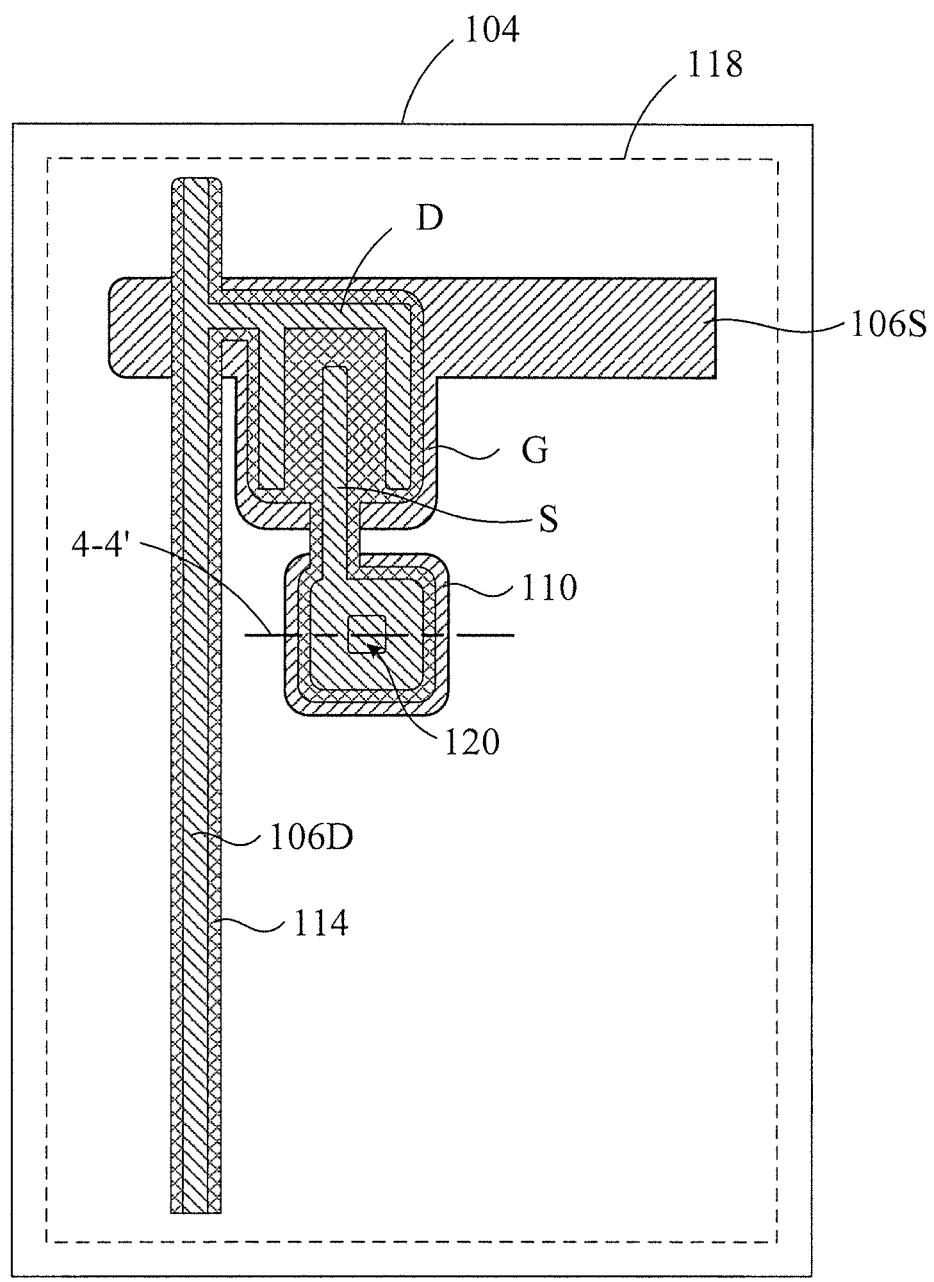
FIG. 4A is a schematic partially planar view of a thin-film transistor (TFT) pixel structure during a fourth manufacturing step according to one embodiment of the present invention.
Figure 4B:
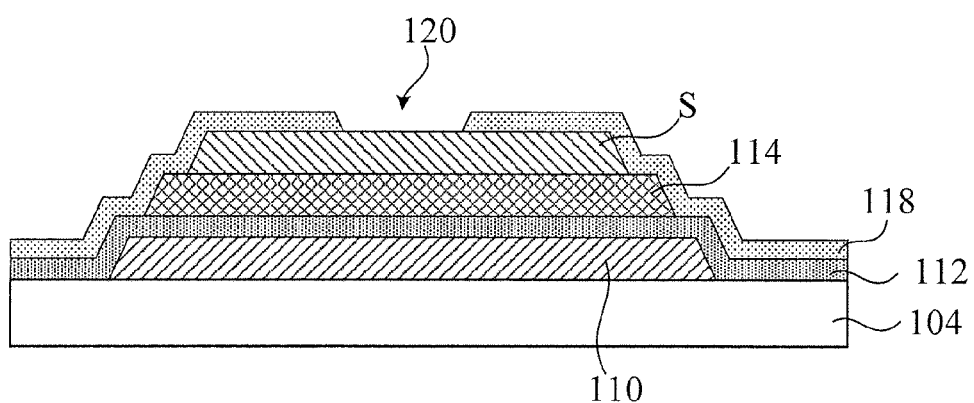
FIG. 4B is a schematic cross-sectional view of the fourth manufacturing step along the line 4-4' in FIG. 4A according to one embodiment of the present invention.

Please refer to FIG. 4A and FIG. 4B. FIG. 4A is a schematic partially planar view of a thin-film transistor (TFT) pixel structure 100 during a fourth manufacturing step according to one embodiment of the present invention. FIG. 4B is a schematic cross-sectional view of the fourth manufacturing step along the line 4-4' in FIG. 4A according to one embodiment of the present invention. A passivation layer 118 is formed on the substrate 104 for covering the data lines 106D and the thin-film transistors. In FIG. 4A and FIG. 4B, a plurality of contact holes 120 are formed in the passivation layer 118, wherein each of the contact holes 120 partly exposes the source layer S and the transparent conducting layer 122 is filled into the contact holes 120 for electrically connecting the transparent conducting layer 122 to the source layer S.

Figure 5A:
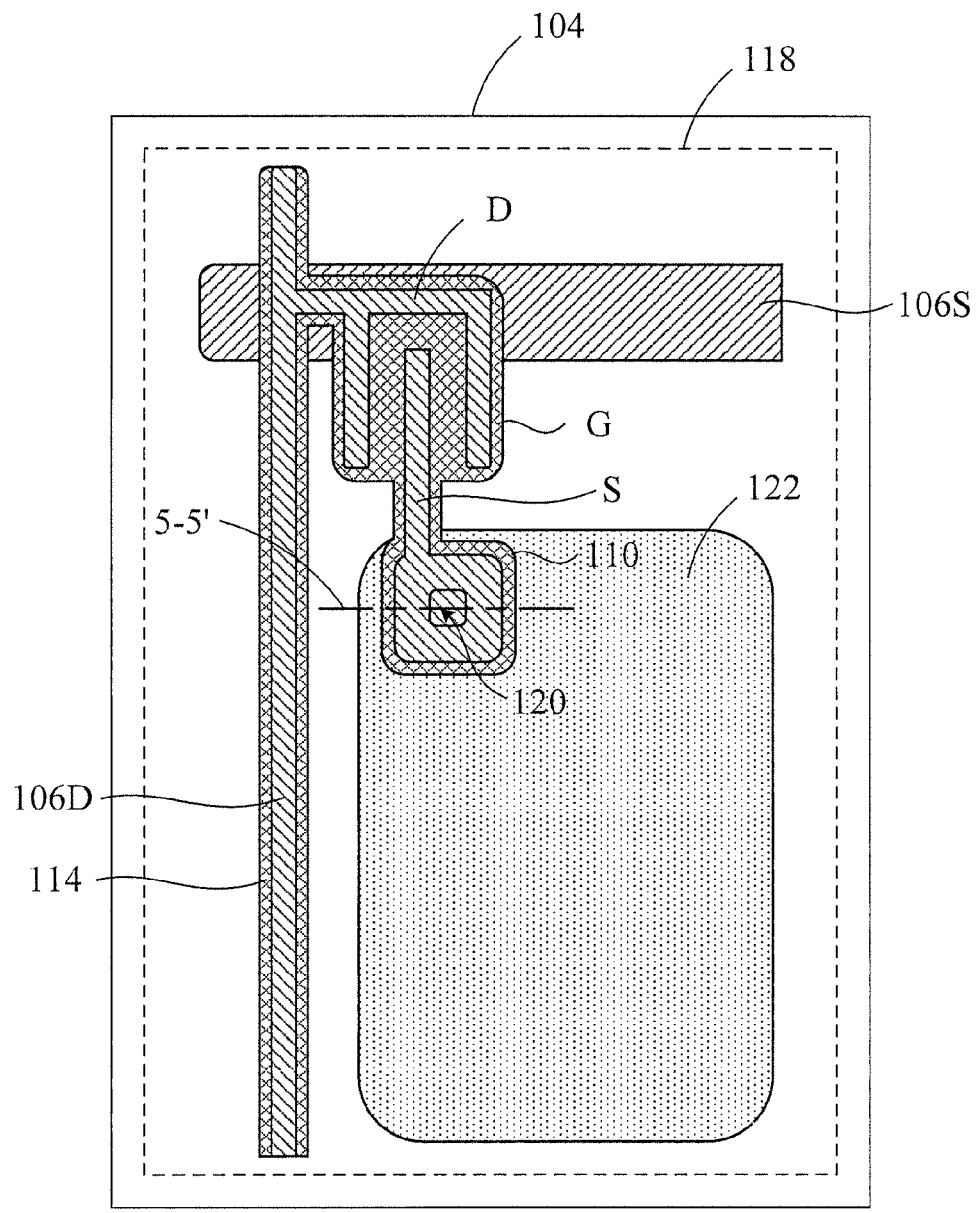
FIG. 5A is a schematic partially planar view of a thin-film transistor (TFT) pixel structure during a fifth manufacturing step according to one embodiment of the present invention.
Figure 5B:
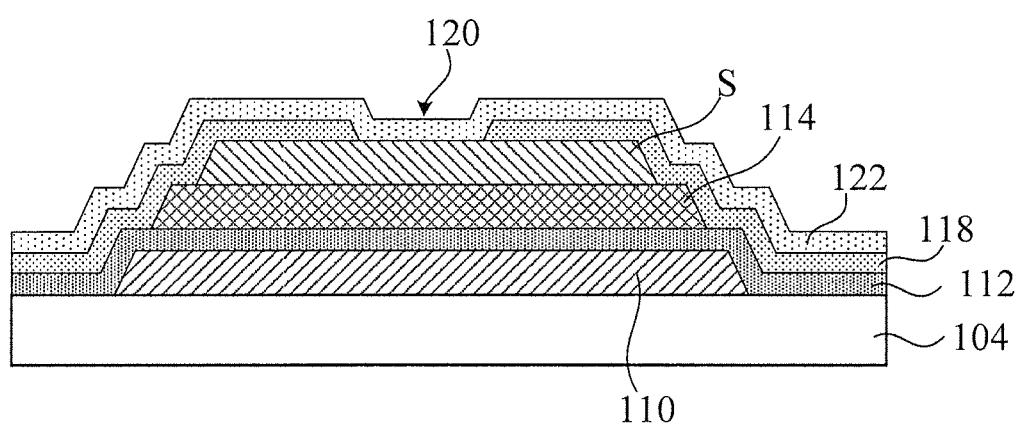
FIG. 5B is a schematic cross-sectional view of the fifth manufacturing step along the line 5-5' in FIG. 5A according to one embodiment of the present invention.

Please refer to FIG. 5A and FIG. 5B. FIG. 5A is a schematic partially planar view of a thin-film transistor (TFT) pixel structure 100 during a fifth manufacturing step according to one embodiment of the present invention. FIG. 5B is a schematic cross-sectional view of the fifth manufacturing step along the line 5-5' in FIG. 5A according to one embodiment of the present invention. As shown in FIG. 4A and FIG. 4B, a transparent conducting layer 122 is formed and coupled to the source layer S for generating a plurality of pixel electrodes to construct the TFT pixel structure 100.

Please continuously refer to FIG. 5A and FIG. 5B. The thin-film transistor (TFT) pixel structure 100 includes a substrate 104, a first conducting layer 102a, a gate insulation layer 112, a channel layer 114, a second conducting layer 102b, contact holes 120, a passivation layer 118 and a transparent conducting layer 122. In FIG. 5A and FIG. 5B, a first conducting layer 102a is disposed on the substrate 104 wherein the first conducting layer 102a includes a plurality of scan lines 106S, a gate electrode layer G electrically connected to the scan lines 106S, and a shielding layer 110. The gate insulation layer 112 is disposed on the substrate 104 for covering the scan lines 106S, the gate electrode layer G and the shielding layer 110. The channel layer 114 is disposed on the gate insulation layer 112 and corresponds to the gate electrode layer G. The material of the channel layer 114 includes an amorphous silicon material. The shielding layer 110 includes either an opaque material layer or a reflective material layer which may be a metal layer.

The second conducting layer 102b is disposed on the substrate 104 and includes a plurality of data lines 106D, a drain layer D coupled to the data lines 106D, and a source layer S which are formed on the channel layer 114 and/or the gate insulation layer 112 to allow the channel layer 114, the source layer S, the drain layer D to construct a plurality of thin-film transistors, wherein the channel layer 114 is disposed between the shielding layer 110 and the source layer S. When a light beam illuminates on the substrate 104, the shielding layer 110 is correspondingly disposed to the channel layer 114 along an emitting direction of the light beam for shielding the channel layer 114 from the light beam by using the shielding layer 110. Thus, the channel layer 114 can prevent the light current from the leakage so that the channel layer avoids the light beam from the backlight module (not shown) to solve the problems of abnormal display quality and image sticking.

In FIG. 5A and FIG. 5B, a passivation layer 118 is disposed on the substrate 104 for covering the data lines 106D and the thin-film transistors. The contact holes 120 are disposed in the passivation layer 118, wherein each of the contact holes 120 partly exposes the source layer S and the transparent conducting layer 122 is filled into the contact holes 120 for electrically connecting the transparent conducting layer 122 to the source layer S. The transparent conducting layer 122 fills into the contact holes 120 and electrically couple to the source layer S for generating a plurality of pixel electrodes. In the present invention, the shielding layer 110 may be correspondingly disposed under the source layer S to prevent the light current from the leakage wherein the shielding layer 110 is either greater than or equal to a width of the channel layer 114. Further, the shielding layer 110 also can be disposed in different positions relative to the channel layer 114. For example, the shielding layer 110 is disposed under the data line 106D to shield the channel layer 114 from the direct illumination of light beam so that the channel layer 114 can prevent the light current from the leakage According to above-mentioned descriptions, the TFT pixel structure and manufacturing method thereof can solve the problems of abnormal display quality and image sticking and maintains the aperture rate of the TFT pixel structure not to be decreased.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A method for manufacturing a thin-film transistor (TFT) pixel structure, the method comprising the steps of:
    forming a first conducting layer on a substrate;
    patterning the first conducting layer for generating a plurality of scan lines, a gate electrode layer electrically connected to the scan lines, and a shielding layer on the substrate;
    forming a gate insulation layer on the substrate for covering the scan lines, the gate electrode layer and the shielding layer;
    forming a channel layer on the gate insulation layer wherein the channel layer corresponds to the gate electrode layer;
    forming a second conducting layer on the substrate and patterning the second conducting layer for generating a plurality of data lines, a drain layer coupled to the data lines, and a source layer on the channel layer to allow the gate electrode layer, the channel layer, the source layer, the drain layer to construct a plurality of thin-film transistors, the channel layer being disposed between the shielding layer and the source layer, wherein when a light beam illuminates on the substrate, the shielding layer is correspondingly disposed to the channel layer along an emitting direction of the light beam for shielding the channel layer from the light beam by using the shielding layer; and forming a transparent conducting layer to be coupled to the source layer for generating a plurality of pixel electrodes.

2. The method of claim 1, wherein the shielding layer comprise either an opaque material layer or a reflective material layer.

3. The method of claim 2, wherein either the opaque material layer or the reflective material layer comprises a metal layer.

4. The method of claim 1, wherein the shielding layer is correspondingly disposed to the source layer.

5. The method of claim 1, wherein a width of the shielding layer is either greater than or equal to a width of the channel layer.

6. The method of claim 1, wherein a width of the shielding layer is either equal to or less than a width of the source layer.

7. The method of claim 1, wherein the channel layer comprises an amorphous silicon material.

8. The method of claim 1, before the step of forming the transparent conducting layer, further comprising the steps of:
   forming a passivation layer on the substrate for covering the data lines and the thin-film transistors; and
   forming a plurality of contact holes in the passivation layer, wherein each of the contact holes partly exposes the source layer and the transparent conducting layer is filled into the contact holes for electrically connecting the transparent conducting layer to the source layer.

9. A thin-film transistor (TFT) pixel structure, comprising:
   a substrate;
   a first conducting layer disposed on a substrate wherein the first conducting layer comprises a plurality of scan lines, a gate electrode layer electrically connected to the scan lines, and a shielding layer;
   a gate insulation layer disposed on the substrate and covering the scan lines, the gate electrode layer and the shielding layer;
   a channel layer disposed on the gate insulation layer and corresponding to the gate electrode layer;
   a second conducting layer disposed on the substrate and comprising a plurality of data lines, a drain layer coupled to the data lines, and a source layer which are formed on the channel layer to allow the channel layer, the source layer, the drain layer to construct a plurality of thin-film transistors, the channel layer being disposed between the shielding layer and the source layer, wherein when a light beam illuminates on the substrate, the shielding layer is correspondingly disposed to the channel layer along an emitting direction of the light beam for shielding the channel layer from the light beam by using the shielding layer; and
   a transparent conducting layer, being filled into a plurality of contact holes and electrically coupled to the source layer for generating a plurality of pixel electrodes.

10. The TFT pixel structure of claim 9, wherein the shielding layer comprise either an opaque material layer or a reflective material layer.

11. The TFT pixel structure of claim 10, wherein either the opaque material layer or the reflective material layer comprises a metal layer.

12. The TFT pixel structure of claim 9, wherein the shielding layer is correspondingly disposed to the source layer.

13. The TFT pixel structure of claim 9, wherein a width of the shielding layer is either greater than or equal to a width of the channel layer.

14. TFT pixel structure of claim 9, wherein a width of the shielding layer is either equal to or less than a width of the source layer.

15. TFT pixel structure of claim 9, wherein the channel layer comprises an amorphous silicon material.

16. TFT pixel structure of claim 9, further comprising:
   a passivation layer disposed on the substrate for covering the data lines and the thin-film transistors; and
   the contact holes disposed in the passivation layer, wherein each of the contact holes partly exposes the source layer and the transparent conducting layer is filled into the contact holes for electrically connecting the transparent conducting layer to the source layer.

* * * * *